(12) United States Patent
Butler et al.

(10) Patent No.: US 9,110,387 B2
(45) Date of Patent: Aug. 18, 2015

(54) LITHOGRAPHIC APPARATUS COMPRISING A SUBSTRATE TABLE AND A SURFACE SUBSTRATE ACTUATOR

(75) Inventors: Hans Butler, Best (NL); Jan Van Eijk, Eindhoven (NL); Sven Antoin Johan Hol, Eindhoven (NL); Johannes Petrus Martinus Bernardus Vermeulen, Helmond (NL); Yang-Shan Huang, Veldhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 397 days.

(21) Appl. No.: 13/477,748

(22) Filed: May 22, 2012

(65) Prior Publication Data

US 2012/0300188 A1    Nov. 29, 2012

Related U.S. Application Data

(60) Provisional application No. 61/489,850, filed on May 25, 2011.

(51) Int. Cl.
    *G03F 7/20*    (2006.01)

(52) U.S. Cl.
    CPC ........ *G03F 7/70783* (2013.01); *G03F 7/70758* (2013.01)

(58) Field of Classification Search
    CPC ............ G03F 7/70758; G03F 7/70783; G03F 7/70816; G03F 7/70775
    USPC .......................................................... 355/72
    See application file for complete search history.

(56) References Cited

U.S. PATENT DOCUMENTS

| | | |
|---|---|---|
| 7,057,702 B2 | 6/2006 | Lof et al. |
| 7,352,434 B2 | 4/2008 | Streefkerk et al. |
| 8,144,310 B2 | 3/2012 | Butler et al. |
| 8,482,719 B2 | 7/2013 | Van Eijk et al. |
| 2005/0007569 A1 | 1/2005 | Streefkerk et al. |
| 2005/0286032 A1 | 12/2005 | Lof et al. |
| 2006/0114445 A1* | 6/2006 | Ebihara .......................... 355/72 |
| 2009/0262325 A1 | 10/2009 | Butler et al. |
| 2011/0013169 A1 | 1/2011 | Lafarre et al. |

(Continued)

FOREIGN PATENT DOCUMENTS

| | | |
|---|---|---|
| JP | S62-046520 | 2/1987 |
| JP | 2005-297109 | 10/2005 |

(Continued)

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

A lithographic apparatus includes an illumination system configured to condition a radiation beam and a support constructed to support a patterning device, the patterning device being capable of imparting the radiation beam with a pattern in its cross-section to form a patterned radiation beam. The lithographic apparatus further includes a substrate table constructed to hold a substrate; a positioner constructed to position the substrate table; a projection system configured to project the patterned radiation beam onto a target portion of the substrate; a substrate surface actuator arranged to engage a part of a surface of the substrate facing the projection system, and a position controller configured to control a position of the substrate table, the position controller being arranged to drive the positioner and the substrate surface actuator.

15 Claims, 4 Drawing Sheets

(56) References Cited

U.S. PATENT DOCUMENTS

| | | |
|---|---|---|
| 2011/0026004 A1 | 2/2011 | Van Eijk et al. |
| 2011/0317142 A1 | 12/2011 | Cox et al. |
| 2013/0149649 A1 | 6/2013 | Polet et al. |

FOREIGN PATENT DOCUMENTS

| | | |
|---|---|---|
| JP | 2007-005363 | 1/2007 |
| JP | 2008-072139 | 3/2008 |
| JP | 2008-160155 | 7/2008 |
| JP | 2010-267144 | 11/2010 |
| JP | 2011-035392 | 2/2011 |
| JP | 2012-009858 | 1/2012 |
| JP | 2013-120933 | 6/2013 |
| TW | 200528935 | 9/2005 |
| TW | 200947175 | 11/2009 |

* cited by examiner

> US 9,110,387 B2

LITHOGRAPHIC APPARATUS COMPRISING A SUBSTRATE TABLE AND A SURFACE SUBSTRATE ACTUATOR

CROSS REFERENCE TO RELATED APPLICATIONS

This application claims priority and benefit under 35 U.S.C. §119(e) to U.S. Provisional Patent Application Ser. No. 61/489,850, entitled "Lithographic Apparatus Comprising Substrate Table", filed on May 25, 2011, the content of which is incorporated herein in its entirety by reference.

FIELD

The present invention relates to a lithographic apparatus comprising a substrate table constructed to hold a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithography, there is a tendency towards substrates having a larger diameter which requires the substrate table to have a large diameter. At the same time, there is a tendency towards higher scanning velocities and scanning accelerations, which requires the substrate table to be lightweight. In order to be able to achieve a desired acceleration, relatively lightweight substrate table structures are desired. Such lightweight structures may, given the high accelerations to which they are subjected, tend to exhibit bending mode excitations, torsion mode excitations, or other effects. As a result thereof, focusing errors may occur when projection the pattern on the substrate.

SUMMARY

It is desirable to provide a lithographic apparatus that enables an accurate in focus positioning of the substrate.

According to an embodiment of the invention, there is provided a lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a positioning device constructed to position the substrate table; and
a projection system configured to project the patterned radiation beam onto a target portion of the substrate,
a substrate surface actuator, the substrate surface actuator configured to engage a part of a surface of the substrate facing the projection system to exert a force on the part of the surface of the substrate, and
a controller configured to control a position of the substrate table, the controller being operably connected to the positioning device and the substrate surface actuator to drive the positioning device and the substrate surface actuator.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
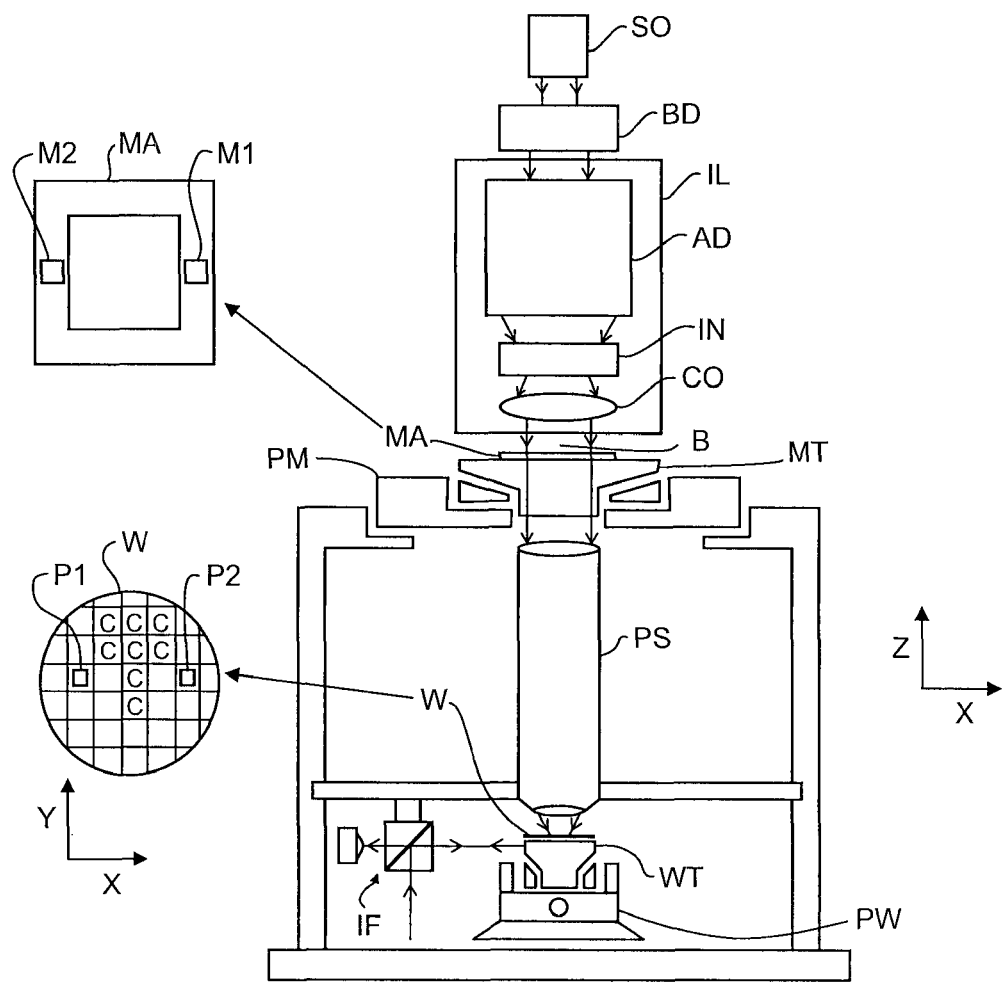
FIG. 1 depicts a lithographic apparatus in which an embodiment of the invention may be provided.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device or positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
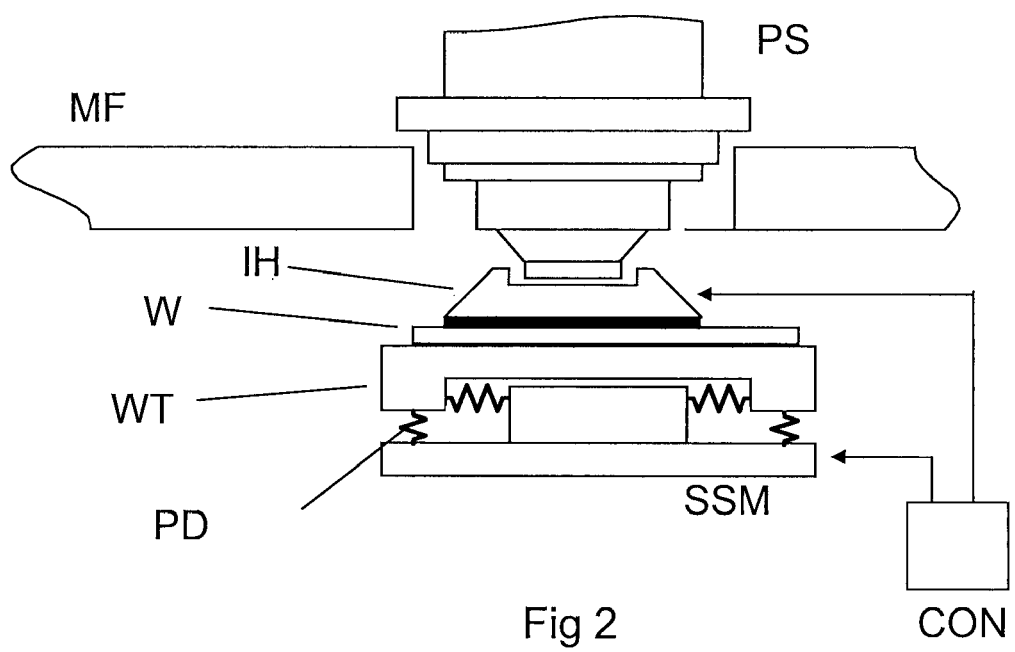
FIG. 2 depicts a schematic side view of a part of a lithographic apparatus in accordance with an embodiment of the invention.

FIG. 2 depicts a schematic side view of a downstream part of the projection system PS, the substrate table WT that holds a substrate W and a liquid supply system IH, such as an immersion hood, that supplies an immersion liquid between the last (downstream) lens of the projection system PS and the substrate W. The projection system is held by means of supports (not shown in FIG. 2) by a metrology frame MF of the lithographic apparatus. The substrate table WT is positioned by positioning device or positioner PD (such as the positioning device PW identified in FIG. 1). The positioning device or positioner may comprise a long stroke actuator (not depicted in FIG. 2) configured to coarsely position the substrate table WT over a large range of movement, and a short stroke actuator SSM to provide a fine positioning of the substrate table WT, the short stroke actuator SSM configured to move with respect to the long stroke actuator. The liquid supply system IH is positioned by one or more actuators of the liquid supply system (not shown in FIG. 2) which actuators position the liquid supply system in respect of the metrology frame.

Due to large sizes of substrate tables and substrates, in combination with high scanning velocities and as a consequence thereof high acceleration forces to which the substrate table is subjected, excitation of internal mode shapes such as torsion modes, bending modes etc. of the substrate table may occur. As a consequence of these excitations, a part of the surface of the substrate table that is below the last (downstream) lens of the projection system and that is to be irradiated, may exhibit a position inaccuracy, in particular in the vertical direction perpendicular to the surface of the substrate W. The conventional position measurement, by interferometer or other means, of wafer table WT with respect to projection lens PS or metrology frame MF is then not a sufficiently accurate measure of the vertical position of the wafer W with respect to projection lens PS.

This effect may at least in part be counteracted by a substrate surface actuator which provides a force onto the surface of the substrate, such as in a vertical direction. As a result, an inaccuracy of the positioning of the substrate surface in respect of a plane of focus of the projection system, may be reduced. A control device or position controller to control the position of the substrate table, may be provided. In accordance with an aspect of the invention, the position controller may be arranged to drive both the substrate surface actuator as well as the positioner (short stroke and/or long stroke motor of the substrate stage).

Figure 3:
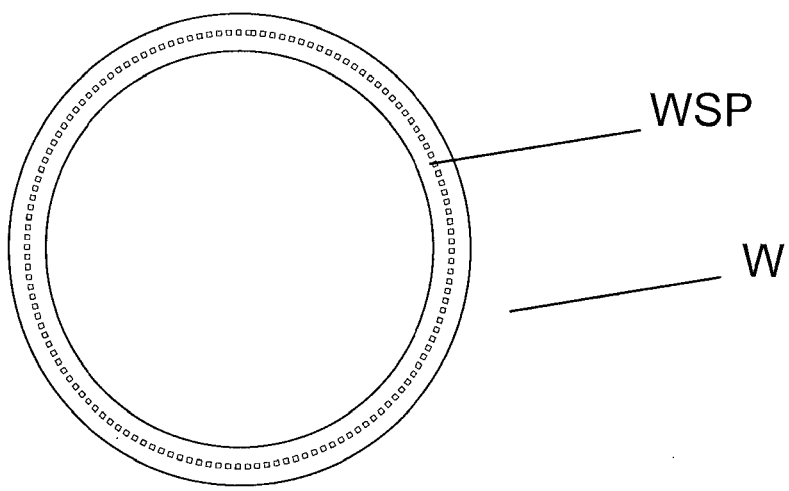
FIG. 3 depicts a top view of a part of a surface of a substrate onto which the lithographic apparatus in accordance with FIG. 2 may act.

Reverting to FIG. 2, in accordance with an aspect of the invention, the substrate surface actuator is comprised in the liquid supply system. The substrate surface actuator and the positioner (in this example the short stroke actuator SSM and possibly the long stroke actuator) are driven by the controller CON. As the substrate surface actuator is comprised in the liquid supply system, no separate actuators are required. As depicted in FIG. 3, the liquid supply system will be able to exert a force onto the surface of the substrate W in the area where a strong coupling is present between a structure of the liquid supply system and the surface of the substrate W. Such strong coupling is present in a circular area WSP where the structure of the liquid supply system is close to the substrate and where a narrow gap is provided between the structure of the liquid supply system and the substrate. As the circular area WSP is outside a part of the surface of the substrate that is irradiated by the projection system in that particular position of the substrate, an impact on the imaging may be avoided.

The actuator hence engages a zone of the surface of the substrate that surrounds a downstream lens of the projection system, seen along a direction of an optical axis of the downstream lens of the projection system.

The immersion liquid in the gap between the structure of the liquid supply system and the substrate provides for a hydrostatic or hydrodynamic coupling (bearing) that, as of a certain minimum frequency, enables to exert a force in the vertical direction on the substrate downwardly as well as upwardly thus to engage with the surface of the substrate.

In order to provide a good engagement with the surface of the substrate, a gap that is wide in the horizontal direction and having a low height is desired, so as to provide a strong coupling between the narrow gap structure of the liquid supply system and the surface of the substrate, as the narrow passage between the surface of the substrate and the structure of the liquid supply system resists against a flowing away of the immersion liquid.

Figure 4:
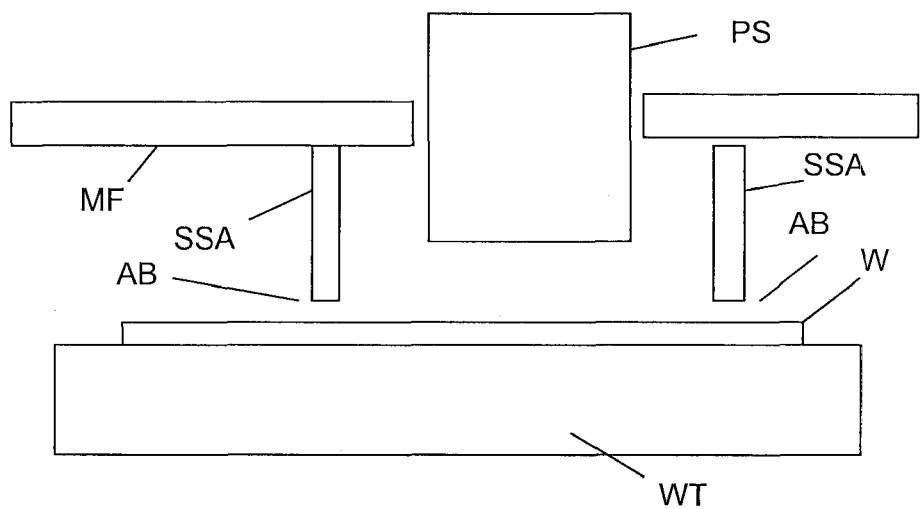
FIG. 4 depicts a schematic side view of a part of a lithographic apparatus in accordance with another embodiment of the invention.

Many alternative embodiments are possible. The substrate surface actuator may for example be formed by one or more separate actuators. In an example, such as depicted in FIG. 4, substrate surface actuators SSA are provided on opposite sides or in a circular area around the projection system PS. The substrate surface actuators may each comprise a Lorentz actuator so as to exert a force in the vertical (z) direction. A coupling, such as a fluid (i.e. liquid or gas) bearing may be provided to contact a surface of the substrate, as will be explained in some more detail below. The actuator may comprise a Lorentz actuator: the Lorentz actuator allows the bearing to follow the surface of the substrate with a minimum effect of a displacement in the vertical direction of the actuator stator onto the actuator force generated by the Lorenz actuator (the force being substantially dependent on an actuator driving current only). With a zero current flowing through the actuator, the bearing tracks the substrate surface without applying a force to it. The force is only dependent on the actuator current and is not dependent on substrate surface height variations or vibrations in the actuator stator, that could be connected to the metrology frame MF. It is noted that in general, a hydrostatic, aerostatic, hydrodynamic or any other suitable bearing may be applied. As depicted in FIG. 4, two substrate surface actuators SSA are provided. Alternatively, three or more substrate surface actuators may be provided, for example arranged equidistantly in a circular zone surrounding the projection system (seen in the direction of the optical axis of the projection system).

Figures 5A, 5B:
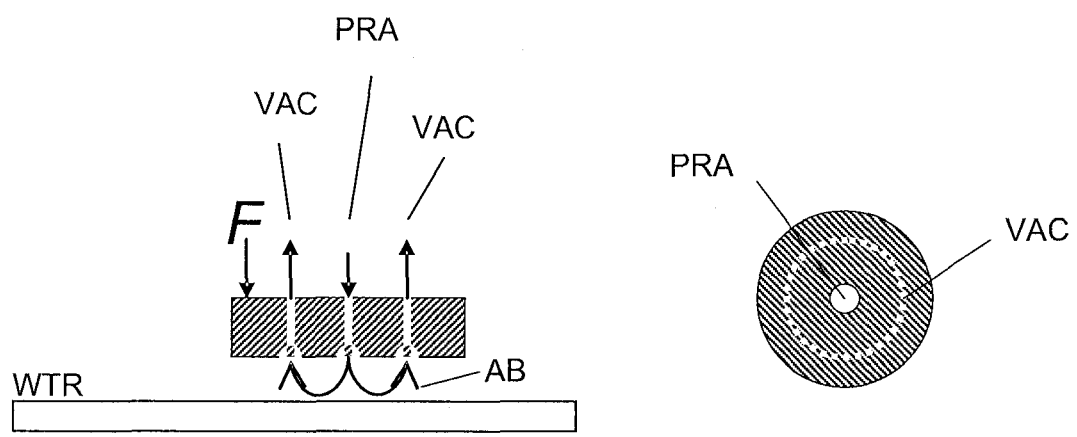
FIGS. 5A and 5B depict a side view and bottom view of an air bearing of a substrate surface actuator in accordance with an embodiment of the invention.

An example of a fluid bearing to contact the surface of the substrate W is explained with reference to FIGS. 5A and 5B. In FIG. 5A, a highly schematic side view is depicted of an end of the substrate surface actuator that faces the surface of the substrate W. A corresponding bottom view is depicted in FIG. 5B. The actuator comprises a central outlet opening PRA through which pressurized air or any other fluid (i.e. liquid or gas) may be guided towards the substrate. Around the central outlet opening PRA, a plurality of inlet openings VAC are provided via which vacuum suction takes place. The pressurized air or other fluid that is supplied into the gap between substrate surface actuator and the surface of the substrate, is released via the openings VAC. When air (or another gas mixture similar to the gas that surrounds the substrate table), is applied, no further drying, cleaning, etc may be required and contamination of the surface of the substrate may be avoided.

In the above examples, in order to prevent the substrate surface actuator SSA from subjecting the metrology frame to reaction forces, in reaction to the actuation of the substrate surface actuator, the substrate surface actuator may be connected to a well-known balance mass which is in turn connected to the metrology frame or base frame by a resilience.

In both the embodiments in accordance with FIGS. 2 and 4, the substrate surface actuator acts on a part of the surface of the substrate that is, seen in the direction of the optical axis of the projection system, surrounding the projection system. Thereby, the substrate surface actuator may act effectively on the part of the surface of the substrate that is to be kept in the plane of focus under the downstream lens of the projection system.

Figure 6:
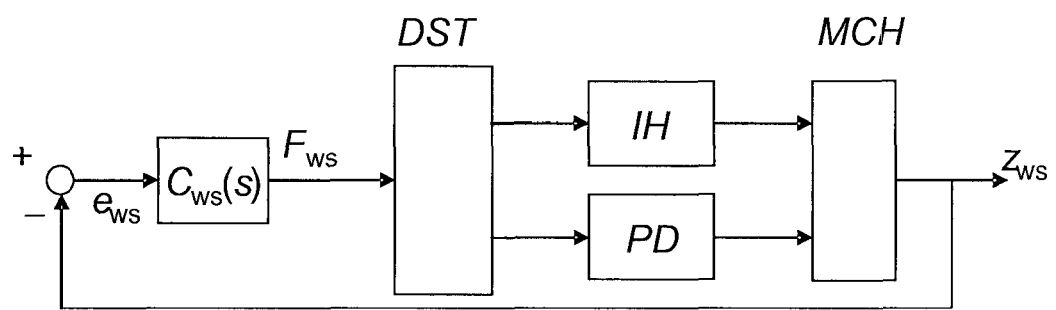
FIG. 6 depicts a control scheme to explain a controlling of the substrate surface actuator in accordance with an embodiment of the invention.

An embodiment of the control system that controls the substrate surface actuator will now be explained with reference to FIG. 6. The control system comprises a controller, such as a substrate stage controller Cws to generate a controller output signal such as a substrate stage force signal Fws from a measured position of the substrate table, in this example a measured position of the substrate table in z direction Zws and a desired position represented by a setpoint (not shown). The control system in accordance with an aspect of the invention further comprises a distribution arrangement DST to distribute the controller output signal Fws of the controller to the substrate surface actuator IH and the positioning device or positioner PD. A mechanics of the stage is represented in the control diagram by a mechanics transfer function MCH.

The controller output signal may comprise a multi dimensional controller output signal, such as a 3-dimensional output signal comprising a component in x, y and z direction, and/or rotational directions about these axes. As the substrate surface actuator may in some embodiments actuate a force on the substrate surface in vertical (Z) direction only, the distribution arrangement may distribute a z component of the controller output signal over the substrate surface actuator and the positioning device or positioner, while providing the remaining components of the controller output signal to the positioning device or positioner only. In the presence of multiple substrate surface actuators acting in Z directions, additionally rotations around the X and Y axes can be controlled.

The positioning device or positioner may comprise a plurality of actuators, such as a short stroke actuator to accurately position the substrate table in combination with a long stroke actuator to coarsely position the substrate table in a larger range of movement.

In order to provide that the substrate surface actuator is activated in certain frequency bands in which torsion modes, resonance modes, etc. of the substrate table may occur, the distribution arrangement may comprise a selection arrangement in a frequency domain, such as a filter. Thereby, the distribution arrangement may selectively provide the controller output signal to the substrate surface actuator in a frequency band of a substrate table resonance mode or a substrate table torsion mode so as to active the substrate surface actuator specifically in such frequency band. In an embodiment the controller output signal to the substrate surface actuator may be low-pass filtered to prevent undesired excitation of the projection lens system PS.

The substrate surface actuator may also be applied to counteract a resonance of a resilience between the substrate table and the short stroke actuator. Thereto, in an embodiment, the distribution arrangement may be arranged to selectively provide the controller output signal substantially to the substrate surface actuator in a frequency band of a resonance of a resilience between the substrate table and the short stroke actuator of the positioning device or positioner.

In order to take into account a position dependency in the behaviour of the substrate table, the distribution arrangement may be arranged to determine the distribution of the controller output signal in dependency on a position of the substrate table, for example in the (X, Y) plane.

In order to obtain information about an excitation of a torsion mode, resonance mode, etc, a suitable sensing may be provided, such as an over-determined position sensing arrangement for sensing a position of the substrate table. Alternatively, the controller may comprise an estimator to estimate an excitation of a torsion mode or resonance mode (such as a torsion mode or resonance mode of the substrate table and/or the resilience between the substrate table and the short stroke actuator) from position measurement data representing a position of the substrate table versus time over a time period.

A coupling between the substrate surface actuator and the surface of the substrate may be dependent on a distance between the substrate surface actuator and the surface of the substrate (or its surrounding structures). A substantially flat structure may be provided in order to avoid substantial variation in the coupling, for example keeping height differences to a maximum of 20 to 30 micrometers. Thereto, a gutter between the substrate and the substrate table may be closed by a so called MES (mechanical edge seal) (US2011/0013169), sensors may be provided with a suitable sticker on top, a bridge may be provided for bridging a transfer of the liquid supply system from a first substrate table to a second substrate table in a dual stage lithographic apparatus, Alternatively, the coupling (or distance) may be quantified in dependency of the substrate table position, and applied to correct an actuation path.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a support constructed to support a patterning device, the patterning device being capable of imparting a radiation beam with a pattern in its cross-section to form a patterned radiation beam;
    a substrate table constructed to hold a substrate;
    a positioner constructed to position the substrate table;
    a projection system configured to project the patterned radiation beam onto a target portion of the substrate,
    a substrate surface actuator arranged to face a part of a surface of the substrate facing the projection system, the substrate surface actuator configured to exert a force on the part of the surface of the substrate, the substrate surface actuator comprising a Lorentz actuator, and
    a position controller configured to control a position of the substrate table, the position controller being operably connected to the positioner and the substrate surface actuator to drive the positioner and the substrate surface actuator, the substrate surface actuator being driven, in use, by said controller to reduce, with said exerted force, an inaccuracy of positioning of the substrate surface with respect to a plane of focus of the projection system, and
    wherein the actuator is arranged to engage at least part of a zone of the surface of the substrate that surrounds a downstream lens of the projection system, seen along a direction of an optical axis of the downstream lens of the projection system.

2. The lithographic apparatus according to claim 1, wherein the substrate surface actuator comprises a hydrostatic bearing configured to engage with the part of the surface of the substrate.

3. The lithographic apparatus according to claim 2, wherein a width of a gap of the hydrostatic bearing is in a range of 5 μm to 300 μm.

4. The lithographic apparatus according to claim 1, wherein the actuator is part of a liquid supply system arranged to apply a liquid between a downstream lens of the projection system and the substrate.

5. The lithographic apparatus according to claim 1, wherein the substrate surface actuator comprises a fluid circulation device configured to apply a fluid to and remove the fluid from a gap adjoining the part of the surface of the substrate.

6. The lithographic apparatus according to claim 1, comprising a balance mass that connects the actuator to a frame of the lithographic apparatus.

7. The lithographic apparatus according to claim 1, wherein the position controller comprises a controller arranged to provide a controller output signal and a distribution arrangement to distribute the controller output signal to the positioner and the substrate surface actuator.

8. The lithographic apparatus according to claim 7, wherein the distribution arrangement comprises a frequency domain selection arrangement, such as a filter.

9. The lithographic apparatus according to claim 7, wherein the distribution arrangement is arranged to selectively provide the controller output signal substantially to the substrate surface actuator in a frequency band of a substrate table resonance mode or a substrate table torsion mode.

10. The lithographic apparatus according to claim 7, wherein the distribution arrangement is arranged to selectively provide the controller output signal substantially to the substrate surface actuator in a frequency band of a resonance of a resilience between the substrate table and a short stroke actuator of the positioner.

11. The lithographic apparatus according to claim 7, wherein the distribution arrangement is arranged to determine the distribution of the controller output signal in dependency on a position of the substrate table.

12. The lithographic apparatus according to claim 1, wherein the controller comprises an estimator configured to estimate an amplitude of an internal mode shape from position measurement data representing a position of the substrate table.

13. The lithographic apparatus according to claim 12, wherein the internal mode shape is an internal mode shape or the resilience between the substrate table and the short stroke actuator, or both the internal mode shape and the resilience between the substrate table and the short stroke actuator.

14. The lithographic apparatus according to claim 13, wherein the internal mode shape is a torsion mode or resonance mode.

15. The lithographic apparatus according to claim 12, wherein the internal mode shape is a torsion mode or resonance mode.

* * * * *